(12) United States Patent
Kurita

(10) Patent No.: US 7,550,936 B2
(45) Date of Patent: Jun. 23, 2009

(54) FAN MOTOR DRIVE CONTROL APPARATUS

(75) Inventor: Yukinobu Kurita, Nagano (JP)

(73) Assignee: Nidec Sankyo Corporation, Nagano (JP)

( * ) Notice: Subject to any disclaimer, the term of this patent is extended or adjusted under 35 U.S.C. 154(b) by 481 days.

(21) Appl. No.: 11/357,236

(22) Filed: Feb. 17, 2006

(65) Prior Publication Data
US 2006/0186850 A1    Aug. 24, 2006

(30) Foreign Application Priority Data
Feb. 18, 2005    (JP) .............................. 2005-041949

(51) Int. Cl.
*H02P 5/00*    (2006.01)

(52) U.S. Cl. .................... 318/255; 318/66; 318/67; 318/69; 318/280

(58) Field of Classification Search ............... 318/66, 318/439, 599, 67, 68, 69, 280, 255, 268, 318/432; 388/804

See application file for complete search history.

(56) References Cited

U.S. PATENT DOCUMENTS 5,438,226 A * 8/1995 Kuchta ........................ 307/125
7,305,316 B2 * 12/2007 Frankel et al. ................. 702/99

FOREIGN PATENT DOCUMENTS

JP    5-2570    1/1993

* cited by examiner

*Primary Examiner*—Bentsu Ro
*Assistant Examiner*—Antony M Paul
(74) *Attorney, Agent, or Firm*—Reed Smith LLP

(57) ABSTRACT

A fan motor drive control apparatus comprises a plurality of drive circuits for driving respectively a plurality of fan motors, and a speed change-over control circuit for transmitting a control signal for changing over speeds of the fan motors, to the plurality of drive circuits, wherein each of the drive circuit comprises a stopping detection terminal for detecting stopping of a fan motor as an object to be driven, and the speed change-over control circuit transmits the control signal in accordance with a signal received from the stopping detection terminal.

5 Claims, 7 Drawing Sheets

FAN MOTOR DRIVE CONTROL APPARATUS

CROSS-REFERENCE TO RELATED APPLICATION

This application claims priority of Japanese Patent Application No. 2005 041949, filed Feb. 18, 2005, the complete disclosure of which is hereby incorporated by reference.

BACKGROUND OF THE INVENTION

1. Field of the Invention

The present invention relates to a fan motor drive control apparatus for controlling the drive of a fan motor used as a cooling unit in an information-process equipment, an electric appliance, a vehicle or the like, and in particular to a fan motor drive control apparatus which can enhance the reliability of an air cooling function.

2. Description of the Related Art

In order to constrain harmful thermal effects in an equipment having a heat source in its housing, such as an information-processing equipment, an electric appliance or a vehicle incorporating an engine, there have been conventionally used configurations that a cooling fan motor is driven for cooling the equipment. There have been motor drive systems of various type, that is, a non-control system in which a fan motor is driven with a constant voltage in order to obtain a constant air volume, a temperature sensing system in which a temperature of a heat source is detected in order to obtain an air volume depending upon the detected temperature during operation of a fan motor.

These years, the performance and the function of the information processing equipment have been increased so that heat generation in electronic components incorporated therein has been increased, and accordingly, efficient air cooling has been increasingly important. For example, a server as a host computer or the like, incorporates a plurality of CPUs, memories and the like in order to materialize high dense packaging and speed-up operation, and accordingly, several fan motors are incorporated in order to enhance the air-cooling efficiency thereof.

Incidentally, in such a case that some of the incorporated fan motors fails so as to come to a stop, the air cooling efficiency is lowered, possibly resulting in occurrence of thermal runaway, and accordingly, readout of electronic data would become impossible at worst. Thus, for failure detection in such a case that a fan motor fails, a speed of the fan motor, a constraint protection signal and the like can be obtained from the fan motor. Thus, these signals are analyzed on the server side in order to find out which one of the fan motors fails so as to come to a stop.

For example, a patent document 1, the Japanese Utility Model Laid-Open No. H05-2570 (FIG. 1) discloses a dual cooling fan unit in which a stand-by motor has been previously prepared for a failure of a motor, and when a failure and stopping of a main fan motor are detected on the server side, the operation is changed over onto the stand-by motor in accordance with a predetermined signal delivered from the fan motor side in order to prevent lowering of the cooling function and an occurrence of thermal runaway.

However, the above-mentioned contrivance disclosed in the above-mentioned patent document 1 offers the following problems in such a case that the two fan motors both have a main-main relationship and not a main and standby relationship.

That is, in order to enhance the cooling efficiency, for example, two fan motors which are incorporated in the server as a host computer are both operated simultaneously. In this case, when one of the fan motors fails and comes to a stop, the air volume is decreased, of course, to a half. On the server side, this failure and stopping of the motor is detected in view of a predetermined signal, as stated above, but the air volume cannot be recovered from the half value unless the failed motor is artificially replaced with new one. As a result, the cooling performance is lowered so that heat radiation from electronic components in the server is insufficient, and accordingly, there would be caused occurrence of thermal runaway and impossible readout of electronic data.

In view of this point, it is contrivable that if a failure and stopping of one of motors is detected on the server side, the speed of the other normal fan motor is increased in order to ensure a sufficient air volume and pressure. However, a fan motor has not, in general, such a function that the speed thereof is spontaneously increased by the motor itself, and accordingly, in this case, an additional function is required on the server side, resulting in unavoidable complication and increased costs.

SUMMARY OF THE INVENTION

The present invention is devised in view of the above-mentioned problems, and accordingly, an object of the present invention is to provide a fan motor drive control apparatus capable of restraining the lowering of an air cooling function so as to prevent occurrence of thermal runaway or the like even if some of fan motors fail and come to a stop in such a case that a plurality of fan motors are operated, and further, capable of enhancing the reliability of the air-cooling function.

To the end, according to the present invention, there is provided a fan motor drive control apparatus comprising a drive circuit for driving a fan motor, a speed change-over control circuit for transmitting a control signal for changing over a speed of the motor, characterized in that the speed change-over control circuit is provided to the drive circuit so as to deliver the above-mentioned control signal in accordance with a signal received from a stopping detection terminal for detecting stopping of a fan motor as an object to be driven.

Specifically, according to the present invention, there are provided fan motor drive control apparatuses having the following configurations:

(1) A fan motor drive control apparatus comprising a plurality of drive circuits for driving respectively a plurality of fan motors, a speed change-over control circuit for transmitting control signals for changing over the speeds of the fan motor to the drive circuits, characterized in that the drive circuits incorporate stopping detection terminals for detecting stopping of fan motors as objects to be driven, and the speed change-over control circuit transmits the control signals in accordance with signals received from the stopping detection terminals in the plurality of drive circuits.

With this configuration of the present invention in which there is provided the fan motor drive control apparatus comprising the stopping detection terminals for detecting stopping of fan motors as objects to be driven, the plurality of drive circuits for driving respectively the plurality of motors, and the speed change-over control circuit for transmitting control signals (for example, H-level voltage signal and L-level voltage signal) for changing over the speeds of the fan motors, to the plurality of drive circuits, wherein the speed change-over control circuit transmits the above-mentioned control signals in accordance with signals received from the stopping detection terminals in the plurality of drive circuits, the operating steps from the detection of stopping (the detection of abnormality) of the fan motor up to the change-over of speeds of the fan motor are automated, thereby it is possible to enhance the reliability of the cooling function.

That is, conventionally, since the fan motor itself has had not a function capable of spontaneously increasing the speed of the motor, the server side inevitably has required such an additional function that when one of fan motors fails so as to come to a stop, the speed of the other normal fan motor is increased to prevent occurrence of thermal runaway. However, according to the present invention, even though no additional function is provided in the server side, the speed of a fan motor is spontaneously increased so as to automatically ensure a sufficient air volume and pressure, and therefore, it is possible to restrain occurrence of thermal runaway and a risk of readout error, and further it is possible to enhance the reliability of the cooling function.

It is noted that any kinds of signals capable of detecting stopping of motors may be used as the signals received form the stopping detection terminals in the plurality of drive circuits. For example, any of signals which are produced in a drive circuit when a fan motor comes to a stop may be used.

Further, the speed change-over control circuit transmits control signals for changing over the speeds of the fan motors to the drive circuits in accordance with the signals received from the stopping detection terminals in the plurality of drive circuits. For example, if the signals are d.c. voltage signals, the control signals may be transmitted when the level of the d.c. signals is changed from H-level to L-level (or L-level to H-level). Further, if the signal is periodical, the control signals may be transmitted when the frequency thereof is changed.

(2) A fan motor drive control apparatus as stated in (1) is characterized in that the above-mentioned speed change-over control circuit receives signals from the stopping detection terminals, which are constraint and protection detecting signals for detecting constraint and protection of the fan motors as objects to be driven.

With the configuration of the present invention in which in the speed change-over control circuit, signals received from the stopping detection terminals are restraint and protection signals (the so-called restriction detected (RD) signal) for detecting constraint and protection of the fan motors as objects to be driven, by utilizing a constraint and protection function added in general to an IC, it is possible to retrain the costs from increasing and to enhance the reliability of the air cooling function.

It is noted that the constraint and protection function becomes active to protect a fan motor and a drive circuit therefor when the fan motor is locked (stopped), and when the constraint and protection function is released, the fan motor is automatically recovered so as to carry out its normal operation. As an example of the constraint and protection function, a motor turn-on period is set to 0.4 sec while a motor turn-off period is set to 6.7 sec., and with the repetitions of both periods, current consumption is constrained so as to monitor the timing of automatic recovery while the fan motor and the drive circuit are protected.

(3) A fan motor drive control circuit as stated in (1), characterized in that in the speed change-over control circuit, signals received from the stopping detection terminals are FG signals which are periodically changed depending upon speeds of the fan motors as objects to be driven.

With the configuration of the present invention in which the signals received from the stopping detection terminals are the FG (Frequency Generator) signals which are periodically changed (as, for example, sinusoidal wave signals or rectangular wave signals), depending upon a speed of the fan motor in the speed change-over control circuit as stated above, by utilizing the frequency generation function added to a general IC, it is possible to constrain the costs from increasing and to enhance the reliability of the air cooling function.

(4) A fan motor drive control circuit as stated in (1) characterized in that the speed control change-over circuit comprises:

an OR gate for receiving signals from the stopping detection terminals in the plurality of drive circuits, and a plurality of speed change-over circuits electrically connected respectively to the plurality of drive circuits, for transmitting the control signals in accordance with an output signal from the OR gate.

With the configuration of the present invention in which the speed change-over control circuit is composed of an OR gate for receiving signals from the stopping detection terminals in the plurality of drive circuit, and a plurality of speed change-over circuits electrically connected respectively to the plurality of drive circuits, for transmitting the above-mentioned control signals in accordance with an output signal from the OR gate, it is possible to constrain the costs from increasing and to enhance the reliability of the air-cooling function.

(5) A fan motor drive control apparatus as stated in (4) is characterized in that the speed change-over control circuit is a two speed change-over circuit including a first change-over switch for transmitting a voltage signal having an H-level in dependence upon an output signal from the OR gate, and a second change-over switch for transmitting a voltage signal having an L-level in accordance with an output signal from the OR circuit.

With the configuration of the present invention in which the above-mentioned speed change-over circuit is the two speed change-over circuit including the first change-over switch (for example, a semiconductor switch) for transmitting a voltage signal having an H-level in dependence upon an output signal from the OR circuit, and the second change-over switch (for example, a semiconductor switch) for transmitting a voltage signal having an L-level in accordance with an output signal from the OR circuit, it is possible to constrain the costs from increasing and to enhance the reliability of the air-cooling function.

With the fan motor drive control circuit according to the present invention, as stated above, when some of a plurality of fan motors on operation fail, the speeds of the other normal fan motors are automatically increased so as to enhance a sufficient air volume and pressure so as to lower the possibility of occurrence of thermal runaway and risk of data read-out error, and further, it is possible to enhance the reliability of the air-cooling function.

DESCRIPTION OF THE PREFERRED EMBODIMENTS

Explanation will be made of preferred embodiments of the present invention with reference to the accompanying drawings.

Figure 1:
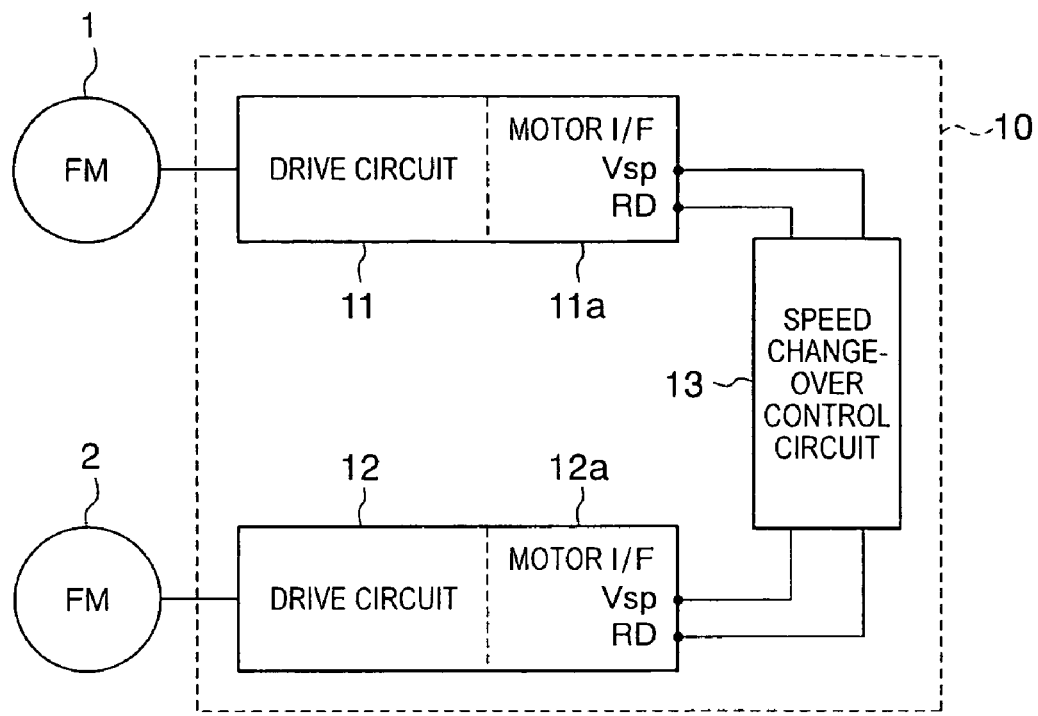
FIG. 1 is a block diagram schematically illustrating a fan motor drive control apparatus according to an embodiment of the present invention.

Referring to FIG. 1 which is a block diagram schematically illustrating a fan motor drive control apparatus 10 in an embodiment of the present invention, the fan motor drive control circuit 10 in this embodiment comprises a drive circuit 11 for driving a fan motor FM1, a drive circuit 12 for driving a fan motor FM2, and a speed change-over control circuit 13 for transmitting a control signal for changing over a speed of a fan motor.

Further, the drive circuit 11 includes a motor I/F 11a having a $V_{SD}$ terminal for receiving a control signal transmitted from the speed change-over control circuit 13 and a RD terminal for detecting constraint/projection of the fan motor FM1, and the drive circuit 12 includes a motor I/F 12a having a $V_{SD}$ terminal for receiving a control signal transmitted from the speed change-over control circuit 13 and an RD terminal for detecting constraint/protection of the fan motor FM 2.

It is noted that the drive circuit 11 and the drive circuit 12 are electrically connected thereto with the speed change-over control circuit 13 by solid wirings, as shown in FIG. 1, but the present invention should not limited to this configuration. That is, the connection may be also made electromagnetically in a wireless manner, or may be optically connected by means of infrared, laser or the like. Further, although the drive circuit 11, the drive circuit 12 and the speed change-over control circuit 13 are provided separate from one another as shown in FIG. 1, these circuits may be embedded in a single substrate so as to apparently constitute a single circuit. Moreover, the functions exhibited by the drive circuit 11, the drive circuit 12 and the speed change-over circuit 13 may be also exhibited by a central processing unit (which is not shown) such as a CPU.

Figure 2:
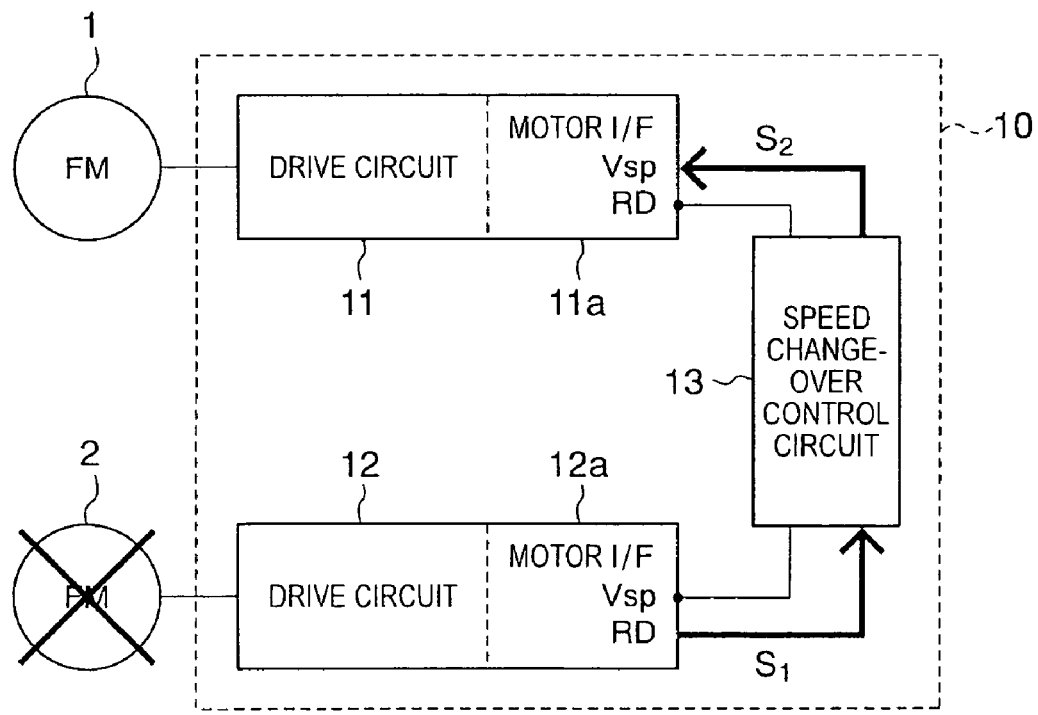
FIG. 2 is a block diagram for schematically illustrating an operation of the fan motor drive control apparatus according to the embodiment of the present invention.

Referring to FIG. 2 which is a block diagram, it is estimated that the fan motor M2 fails due to an accident so as to come to a stop, and accordingly, the fan motor M2 is locked (indicated by an X mark in the figure). Thus, a constraint/protection function in the drive circuit 12 becomes effective, and accordingly, a constraint/protection signal $S_1$ with which a d.c. voltage level is shifted from an L-level to an H-level is detected at the RD terminal. Further, the speed change-over control circuit 13 transmits a speed change-over control signal $S_2$ for increasing the speed of the fan motor FM1 in accordance with the constraint/protection signal $S_1$ to the drive circuit 11. As a result, the speed of the fan motor FM1 is automatically increased by the drive circuit 11.

Thus, with this fan motor drive control apparatus 10, even though no additional function is provided on the server side, the speed of the fan motor side may be spontaneously increased so as to automatically ensure a sufficient air volume and pressure. As a result, it is possible to enhance the reliability of the air-cooling function.

A more detailed explanation of a circuit configuration as to the drive circuits 11, 12 and the speed change-over control circuit 13 is provided.

Figure 3:
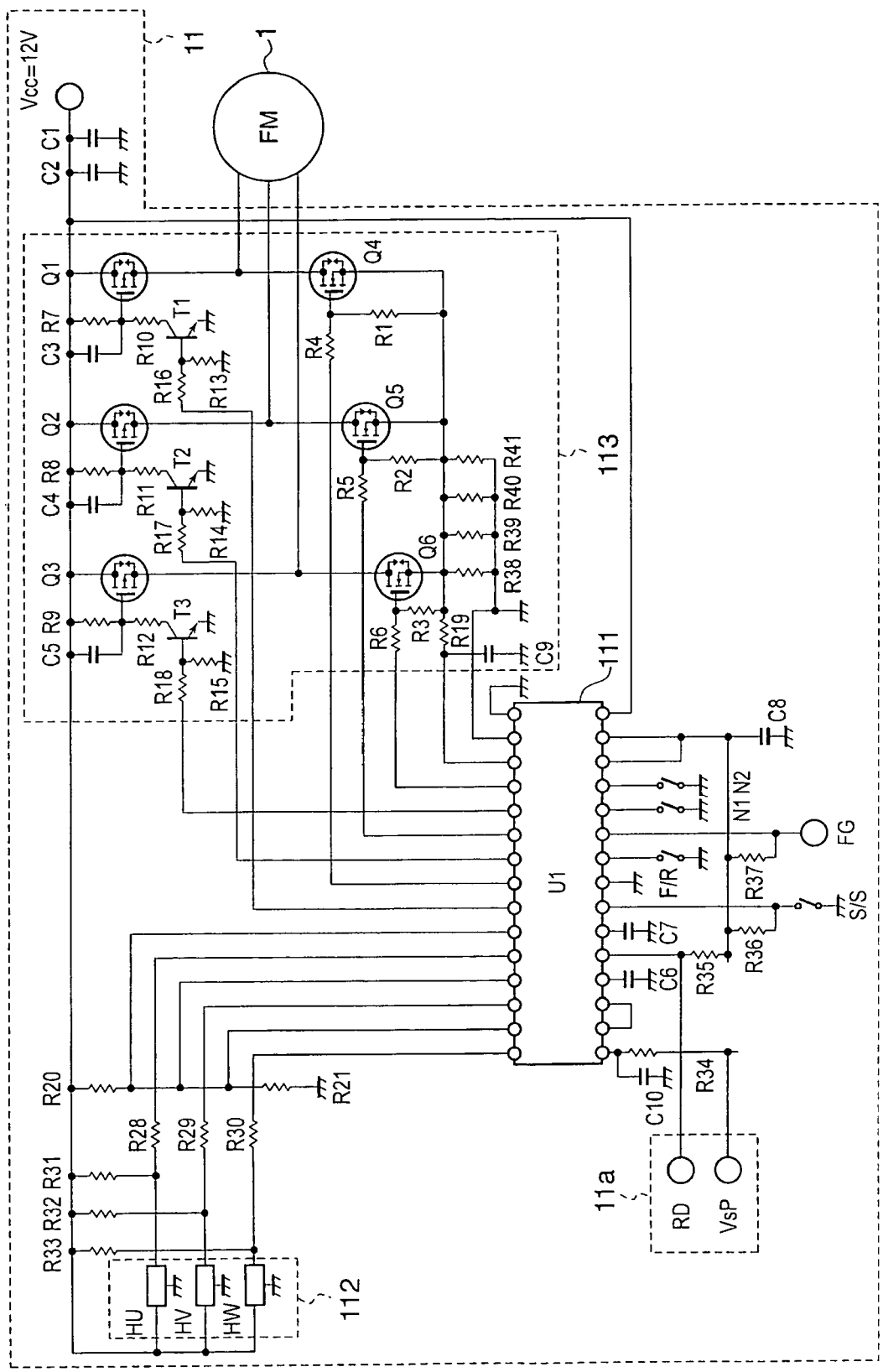
FIG. 3 is a circuit diagram illustrating a drive circuit incorporated in the fan motor drive control circuit according to the embodiment of the present invention.

FIG. 3 is a circuit diagram illustrating the drive circuit 11 incorporated in the fan motor drive control apparatus 10 in the embodiment of the present invention. It is noted that the drive circuit 11 shown in FIG. 2 is of a 3-phase all-wave brushless motor drive type. Although the circuit diagram shows the drive circuit 11, the circuit diagram as to the drive circuit 11 is basically similar the configuration shown in FIG. 3.

Referring to FIG. 3, the drive circuit 11 includes, totally in the entire circuit, a fan motor drive IC 111 and three hole ICs (HU, HV, HW), and is specifically composed of a position detecting portion 112 for detecting a position of the fan motor FM1, six field effect transistors (MOSFET), a power supply portion 113 for feeding a power to the fan motor FM1, the motor I/F 11a including the RD terminal and $V_{SP}$ terminal, an FG signal terminal synthesized with hole ICs (HU, HV, HW) of the fan motor FM1, and a start/stop terminal (S/S terminal) at which transition from an H-level to an L-level becomes effective when the revolution of the fan motor FM1 is started.

When the fan motor FM1 fails, the fan motor drive IC 111 transmits a constraint/protection signal with the d.c. voltage being shifted from an H-level to a L-level, to the RD terminal. Meanwhile, when the fan motor drive IC 111 receives a speed change-over control signal from the speed change-over control circuit 13, it may increase the speed of the fan motor FM1 through the intermediary of the power supply portion 113.

Figure 4A:
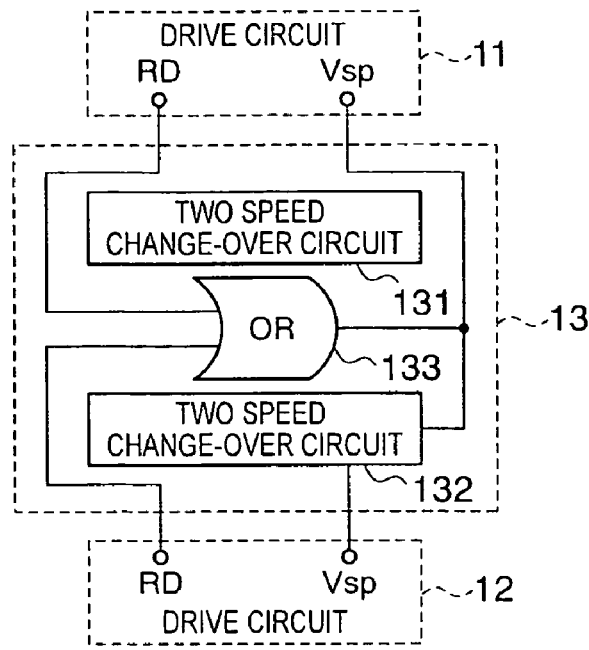
FIGS. 4A, 4B and 4C are block diagrams illustrating a speed change-over control circuit incorporated in the fan motor drive control apparatus according to the embodiment of the present invention.
Figure 4B:
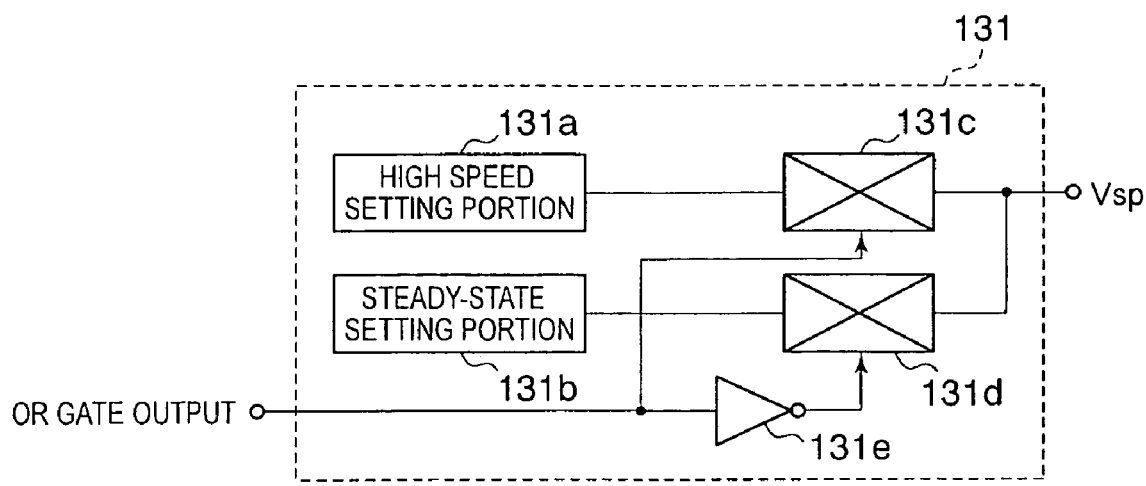
Figure 4C:
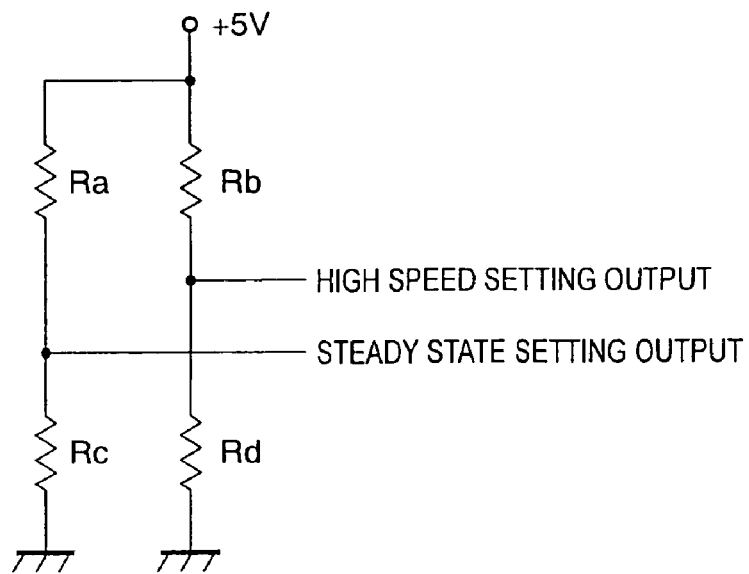

FIGS. 4A to 4C are block diagrams illustrating the speed change-over control circuit 13 incorporated in the fan motor drive control apparatus in this embodiment of the present invention. FIG. 4A is a block diagram schematically illustrating the speed change-over control circuit 13. FIG. 4B is a block diagram schematically illustrating a two speed change-over circuit 131 in the speed change-over control circuit 13. FIG. 4C is a circuit diagram illustrating an example of the two speed change-over circuit 131a in the speed change-over control circuit 13 in a specified form.

Referring to FIG. 4A, the speed change-over control circuit 13 is composed of a two speed change-over circuit 131 for transmitting a speed change-over control signal to the $V_{SD}$ terminal of the drive circuit 11, a two speed change-over circuit 132 for transmitting a speed change-over control signal to the $V_{SD}$ terminal of the drive circuit 12, and an OR gate 133 for receiving constraint/protection signals transmitted from the RD terminals of the drive circuit 11 and the drive circuit 12. It is noted that an output signal from the OR gate 133 is transmitted to the two speed change-over circuit 131 and the two speed change over circuit 132.

Although the OR gate 113 is, as shown in FIG. 4A, used for receiving constraint/protection detecting signals transmitted from the RD terminals of the drive circuit 11 and the drive circuit 12, it should be noted that any component such as a mechanical relay, a semiconductor relay or a hybrid relay, which can exhibit a multi-input/output function may be used.

Referring to FIG. 4B, the two speed change-over circuit shown in FIG. 4A, is composed of a high speed setting portion 131a for delivering a d.c. voltage signal having an H-level so as to operate the fan motor FM1 at a high speed, a steady-state setting portion 131b for delivering a d.c. voltage signal having an L-level so as to operate the fan motor FM1 in a steady-state setting condition, a semiconductor switch 131c for transmitting the d.c. voltage signal having an H-level delivered from the high speed setting portion 131a, to the $V_{SD}$ terminal of the drive circuit 11 in accordance with an output from the OR gate 133, a semiconductor switch 131d for transmitting the d.c. voltage signal having an L-level delivered from the steady-state setting portion 131b to the $V_{SD}$ terminal of the drive circuit 11 in accordance with an output from the OR gate 131e which is obtained by way of a NOT gate 131e, and the NOT gate 131e.

It is noted that although an analog switch (semiconductor switch) may be, in general, used as the semiconductor switches 131c, 131d, the present invention should not be limited to this configuration. A mechanical relay, a semiconductor relay, a hybrid relay or the like may also be used.

It is noted here that the high speed setting portion 131a and the steady-state setting portion 131b shown in FIG. 4B are embodied as shown in FIG. 4C. Referring to FIG. 4C, a series circuit of a resistor Ra and a resistor RC and a series circuit of a resistor Rb and a resistor Rd are connected in parallel, the resistor Ra and the resistor Rb are connected at their one end to a +5 V terminal, and the resistor Rc and the resistor Rd are connected at their one end to the ground. Further, a d.c. voltage signal having an L-level is delivered as a steady-state setting output from the node point between the resistor Ra and the resistor Rc, and a d.c. voltage signal having an H-level is delivered as a high speed setting output from the node between the resistor Rb and the resistor Rd.

Figure 5:
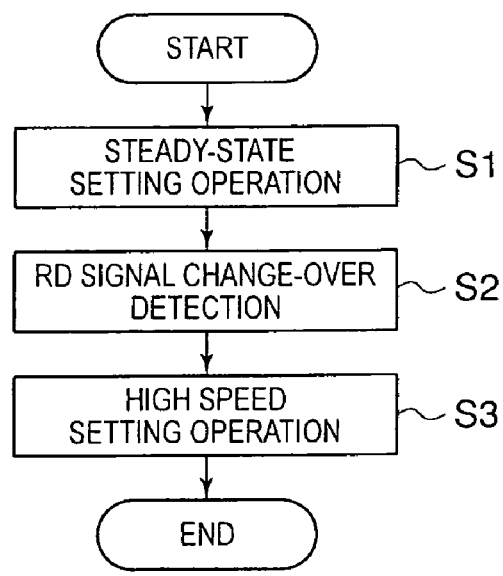
FIG. 5 is a flow-chart for explaining a process operation of the fan motor drive control apparatus according to the embodiment of the present invention.

Referring to FIG. 5 which is a flow chart for explaining the process operation of the fan motor drive control apparatus in the embodiment of the present invention, it is estimated that the fan motor FM1 and the fan motor FM2 carry out steady-state setting operation (step S1). More specifically, it is estimated that, in the drive circuit (Refer to FIG. 3), the fan motor drive IC 111 receives a d.c. voltage signal having an L-level state from the speed change-over control circuit 13 at the $V_{SD}$ terminal, and drives the fan motor FM1 in a steady-state setting mode (at a steady-state speed) by way of the power supply portion 113. Similarly, it is estimated that, even in the drive circuit 12, the fan motor FM2 is driven in a steady-state setting mode (at a steady-state speed).

When the fan motor FM2 fails so as to come to a stop due to an accident, RD signal detection is carried out (step S2). More specifically, in the drive circuit 12, if the fan motor FM2 fails so as to come to a stop due to an accident, a constraint/protection function becomes effective in the drive circuit 12, and accordingly, a constraint/protection signal with which the d.c. voltage signal is shifted from the H-level into the L-level is detected at the RD terminal of the drive circuit 12.

Finally, the fan motor FM1 which does not fail carries out high speed setting operation (step S3). More specifically, when the constraint/protection detecting signal is detected at the RD terminal of the drive circuit 12, the speed change-over circuit 13 receives the signal as an input to the OR gate 133 (Refer to FIG. 4A). Thus, an output from the OR gate 133 is shifted from an L-level into an H-level.

Further, the output from the OR gate is inputted to the two speed change-over circuit 131 and the two speed change over circuit 132. In the two speed change-over circuit 131 (Refer to FIG. 4B), the output from the OR gate which is shifted from an L-level into an H-level is directly inputted to the semiconductor switch 131c, and an output from the OR gate 133 which is shifted from an H-level into an L-level is inputted to the semiconductor switch 131d by way of the NOT gate 131e. Thus, the semiconductor switch 131c is turned on while the semiconductor switch 131d is turned off, and accordingly, a d.c. voltage signal having an H-level is delivered from the high speed setting portion 131a to the $V_{SD}$ terminal of the drive circuit 11. As a result, when the fan motor drive IC 111 receives a d.c. voltage signal as a speed change-over control signal from the speed change-over control circuit 13, the fan motor drive IC 111 increase the speed of the fan motor FM1 by way of the power supply portion 113. Thus, the fan motor drive control apparatus 10 can automatically increase the speed of the fan motor drive FM1 which is normally operated with no failure.

It is noted that although the two speed change-over circuit 132 receives the above-mentioned d.c. voltage signal at the $V_{SD}$ terminal from the speed change-over control circuit 13, similar to the two speed change-over circuit 131, since the constraint/protection function (a constraint/protection circuit) is effective, the fan motor FM2 still fails so as to come to a stop, as it is.

Figures 6A, 6B:
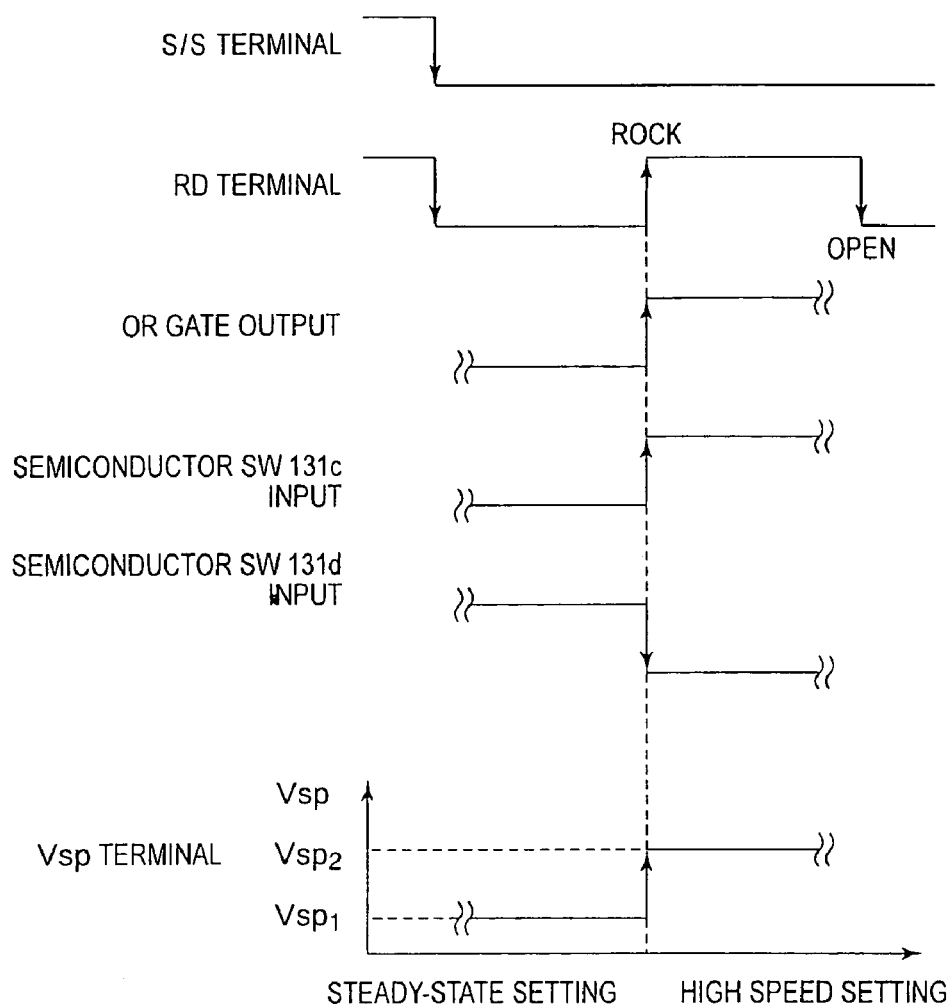
FIGS. 6A and 6B are charts for explaining operation timings of the process operation of the fan motor drive control apparatus according to the embodiment of the present invention.

FIGS. 6A and 6B are views for explaining operation timing of the process operation of the fan motor drive control apparatus in the embodiment of the present invention.

Referring to FIG. 6A, when the fan motor FM1 and the fan motor FM2 start their revolution, the d.c. voltage signal is shifted from an H-level into an L-level at S/S terminal (Refer to FIG. 3) in the drive circuit 11. At this time, the d.c. voltage signal is shifted from an H-level into an L-level. It is noted that the operation in the drive circuit 12 is similar.

Next, if the fan motor FM2 fails so as to come to a stop by an accident, the fan motor FM2 is locked, and the d.c. voltage signal at the RD terminal is shifted from an L-level into an H-level (at a second stage from the above). At this time, in the speed change-over control circuit 13, the constraint/protection signal having an H-level transmitted from the RD terminal of the drive circuit 12 is delivered to the OR circuit 133, and an output from the OR gate 133 is shifted from an L-level into an H-level (third stage from the above). It is noted that the OR gate 133 is operated being based upon a table of truth values shown in FIG. 6B. That is, when one or both of the RD terminal of the drive circuit 11 and the RD terminal of the drive circuit 12 becomes an H-level, the output of the OR gate 133 is also shifted from an L-level into an H-level.

Further, the output (H-level) from the OR gate 133 is directly inputted to the semiconductor switch 131c (a fourth stage from the above), and is inputted to the semiconductor switch 131d (a fifth state from the above) by way of the NOT gate 131e (being turned into an L-level). Thus, the semiconductor switch 131c is turned on while the semiconductor switch 131d is turned off, and accordingly, a d.c. voltage signal ($V_{SD2}$) having an H-level is outputted to the $V_{SD}$ terminal of the drive circuit 11 (a sixth stage from the above), instead of a d.c. voltage signal ($V_{SD1}$) having an L-level. As a result, the fan motor drive IC 111 can increase the speed of the fan motor FM1, as stated above.

Figure 7:
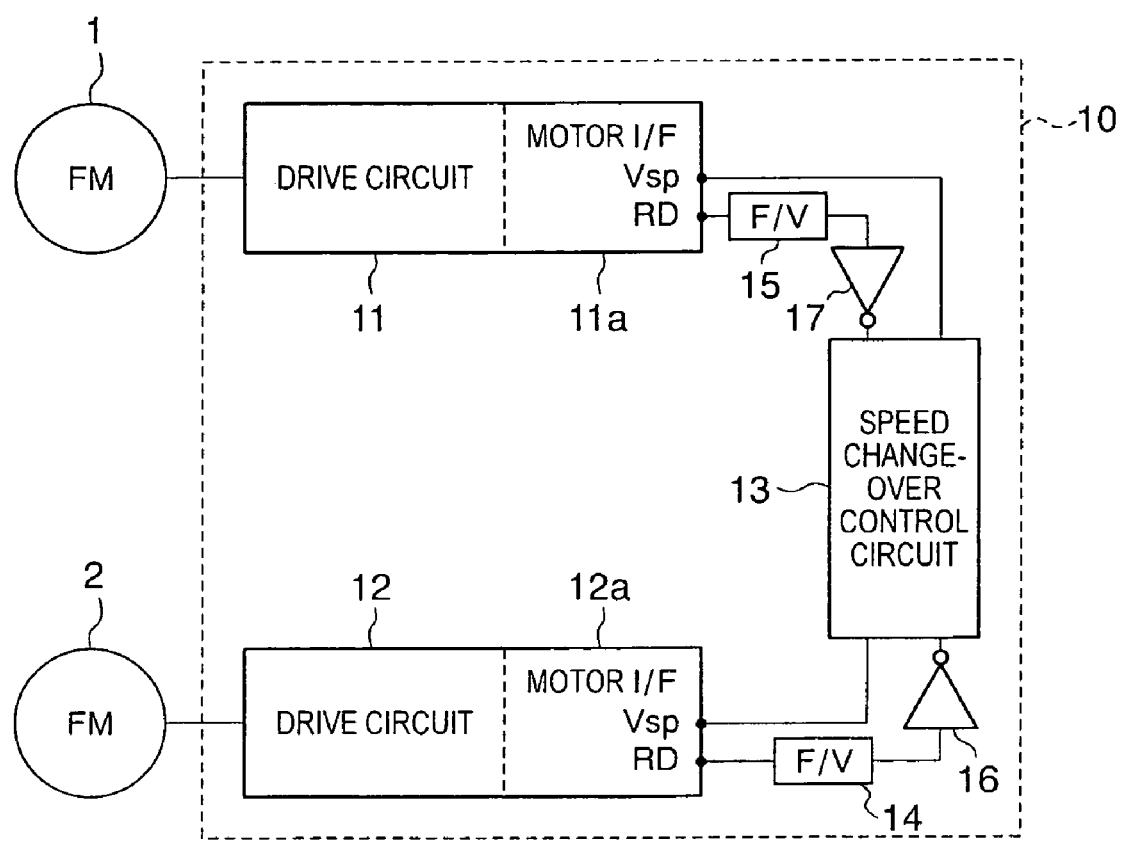
FIG. 7 is a block diagram that illustrates a fan motor drive control apparatus according to another embodiment of the present invention.

FIG. 7 is a block diagram schematically illustrating a fan motor drive control apparatus 10 in another embodiment of the present invention. In particular, in FIG. 7, an FG terminal (Refer to FIG. 3) is used as the stopping detection terminal for detecting stopping of a fan motor as an object to be driven, instead of the RD terminal. Further, an FG signal obtained at the FG terminal of the drive circuit 12 is not directly inputted to the OR gate 133 in the speed change over control circuit 13, but it is inputted by way of an F/V converter 14 and a NOT gate 16, and further, an FG signal obtained at the FG terminal of the drive circuit 11 is not directly inputted to the OR gate 133 in the speed change-over control circuit 13, but it is inputted by way of an F/V converter 15 and a NOT gate 17. Explanation will be hereinbelow made of the operation timing in the process operation of the fan motor drive control apparatus 10' shown in FIG. 7.

Figure 8A:
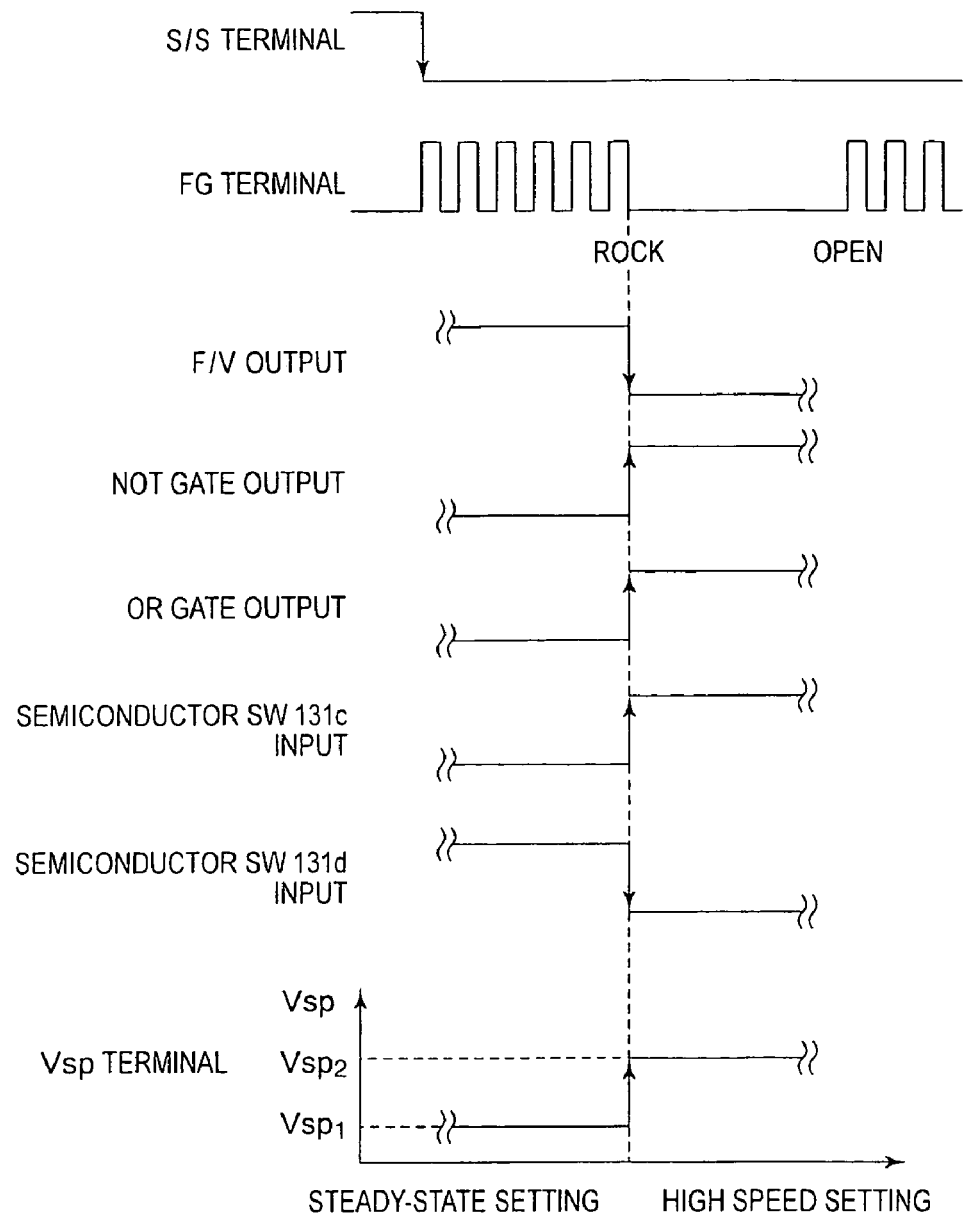
FIGS. 8A and 8B illustrate the operation timing in the process operation of the fan motor drive control apparatus according to another embodiment of the present invention.
Figure 8B:
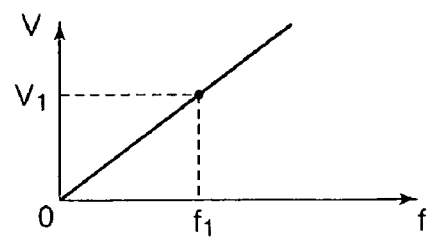

FIGS. 8A and 8B are views for explaining the operation timing in the process operation of the fan motor drive control apparatus in another embodiment of the present invention.

Referring to FIG. 8A, when the fan motor FM1 and the fan motor FM2 start their revolution, a d.c. voltage signal is shifted from an H-level into an L-level at at the S/S terminal in the drive circuit 11 (Refer to FIG. 3). At this time, a rectangular wave sinusoidal signal (FG signal) is obtained at the FG terminal of the drive circuit 11 (a two stage from the above). It is noted that the FG signal is adapted to select a pin in the fan motor drive IC 111 so as to obtain any of various frequencies.

Next, when the fan motor FM2 fails so as to come to a stop by an accident, the fan motor FM2 is locked, and accordingly the frequency of the FG signal becomes zero. Thus, an output from the F/V converter 14 becomes zero (L-level). More specifically, as shown in FIG. 8B, before the failure and stopping of the fan motor FM2, the output of the F/V converter 14 is $V_1$ since the frequency of the FG signal is $f_1$, but after the failure and stopping of the fan motor FM2, the output of the F/V converter 14 become zero (L-level) since the frequency of the FG signal is zero.

At this time, in the speed change-over control circuit 13, a constraint/protection signal having an L-level transmitted from the FG terminal of the drive circuit 12 by way of the NOT gate 15 is inputted to the OR gate 133, and accordingly, the output of the OR gate is shifted from an L-level into an H-level (a fifth stage from the above). Subsequently, as explained in FIG. 6, the semiconductor switch 131c is turned on, and accordingly, the fan motor FM1 carries out high speed setting operation.

As stated above, with the fan motor drive control apparatus 10, 10' according to the embodiments of the present invention, even though some of a plurality of fan motors fail to come to a stop, by operating the other normal fan motors at a higher speed, the air cooling function is restrained from lowering, thereby it is possible to prevent occurrence of thermal runaway or the like, and further it is possible to enhance the reliability of the air cooling function.

It is noted that although a three-phase motor structure is used in the above-mentioned embodiments, the present invention may also be applied to a single phase all-wave drive type fan motor, a two phase half-wave drive type motor or the like. Further, although two fan motors are used in the above-mentioned embodiment, the present invention should not be limited to this number, but not less than three fan motors may be used.

The fan motor drive control apparatus according to the present invention is useful in view of such a fact that even though some of a plurality of fan motors fail, the air cooling function is restrained from lowering so as to prevent occurrence of thermal runaway, thereby it is possible to enhance the reliability of the air cooling function.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A fan motor drive control apparatus comprising:
a plurality of drive circuits for driving a plurality of fan motors which are used simultaneously to obtain a predetermined air volume; and
a speed change-over control circuit for transmitting a control signal for changing over speeds of the fan motors, to the plurality of the drive circuits,
wherein each of the drive circuits for driving the fan motors respectively comprises a stopping detection terminal for detecting constraint stopping of a corresponding fan motor, and
wherein the speed change-over control circuit receives a signal, as an input, transmitted from the stopping detection terminal of the drive circuit which is connected to a stopped fan motor, and transmits the control signal in accordance with the signal received from the stopping detection terminal to another drive circuit, which is also used for obtaining the predetermined air volume, to increase a speed of the fan motor which is connected to the another drive circuit for ensuring the predetermined air volume.

2. A fan motor drive control apparatus as set forth in claim 1,
wherein, in the speed change-over control circuit, a signal received from the stopping detection terminal is a constraint/protection detecting signal for detecting a constraint/protection of a fan motor as an object to be driven.

3. A fan motor drive control apparatus as set forth in claim 1,
wherein a signal received from the stopping detection terminal is an frequency generator signal which is periodically changed depending upon a speed of a fan motor as an object to be driven.

4. A fan motor drive control apparatus as set forth in claim 1,
wherein the speed change-over control circuit is composed of an OR gate for receiving signals, as an input, from the stopping detection terminals in the plurality of drive circuits, and a plurality of speed change-over circuits electrically connected respectively to the plurality of drive circuits, for transmitting the control signal in accordance with an output signal from the OR gate.

5. A fan motor drive control apparatus as set forth in claim 4,
wherein each of the speed change-over circuits is a two speed changeover circuit including a first change-over switch for transmitting a voltage signal having an H-level in accordance with an output signal from the OR gate, and a second change-over switch for transmitting a voltage signal having an L-level in accordance with an output signal from the OR gate.

* * * * *